US012790442B2

(12) United States Patent
Suzuki et al.

(10) Patent No.: US 12,790,442 B2
(45) Date of Patent: Nov. 10, 2026

(54) POLYSILAZANE, SILICEOUS FILM-FORMING COMPOSITION COMPRISING THE SAME, AND METHOD FOR PRODUCING SILICEOUS FILM USING THE SAME

(71) Applicant: Merck Patent GmbH, Darmstadt (DE)

(72) Inventors: Katsuchika Suzuki, Kakegawa (JP); Toshiya Okamura, Kakegawa (JP); Tetsuo Okayasu, Kakegawa (JP); Thorsten Vom Stein, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 804 days.

(21) Appl. No.: 18/029,388

(22) PCT Filed: Sep. 29, 2021

(86) PCT No.: PCT/EP2021/076728
§ 371 (c)(1),
(2) Date: Mar. 30, 2023

(87) PCT Pub. No.: WO2022/069507
PCT Pub. Date: Apr. 7, 2022

(65) Prior Publication Data

US 2023/0374226 A1 Nov. 23, 2023

Related U.S. Application Data

(60) Provisional application No. 63/087,139, filed on Oct. 2, 2020.

(51) Int. Cl.

| | |
|---|---|
| ***C08G 77/62*** | (2006.01) |
| ***C08L 83/16*** | (2006.01) |
| ***C09D 183/16*** | (2006.01) |
| *H10W 10/00* | (2026.01) |
| *H10W 10/17* | (2026.01) |

(52) U.S. Cl.
CPC .............. *C08G 77/62* (2013.01); *C08L 83/16* (2013.01); *C09D 183/16* (2013.01); *C08L 2203/16* (2013.01); *C08L 2203/206* (2013.01); *H10W 10/014* (2026.01); *H10W 10/17* (2026.01)

(58) Field of Classification Search
CPC ...................................................... C08G 77/62
See application file for complete search history.

(56) References Cited

U.S. PATENT DOCUMENTS

| | | | | |
|---|---|---|---|---|
| 2016/0379817 | A1* | 12/2016 | Okamura | H01L 21/02222 438/781 |
| 2017/0044401 | A1 | 2/2017 | Yamakawa et al. | |
| 2017/0240423 | A1 | 8/2017 | Fujiwara et al. | |
| 2018/0072571 | A1* | 3/2018 | Sanchez | C01B 21/087 |
| 2020/0277190 | A1 | 9/2020 | Sanchez et al. | |
| 2023/0374226 | A1* | 11/2023 | Suzuki | C08G 77/62 |

FOREIGN PATENT DOCUMENTS

| | | | |
|---|---|---|---|
| CN | 105793963 | A | 7/2016 |
| CN | 106232687 | A | 12/2016 |
| EP | 3082153 | A1 | 10/2016 |
| JP | 05-105486 | A | 4/1993 |
| JP | 10-245436 | A | 9/1998 |
| JP | 2013-162072 | A | 8/2013 |
| JP | 2020-513392 | A | 5/2020 |
| KR | 10-1056838 | B1 | 8/2011 |
| WO | 2015/087847 | A1 | 6/2015 |
| WO | 2015/163360 | A1 | 10/2015 |

OTHER PUBLICATIONS

International Search Report and Written Opinion received for PCT Patent Application No. PCT/EP2021/076728, mailed on Jan. 17, 2022, 8 pages.

* cited by examiner

*Primary Examiner* — Margaret G Moore
(74) *Attorney, Agent, or Firm* — Faegre Drinker Biddle & Reath LLP

(57) ABSTRACT

A polysilazane having a ratio of the amount of $SiH_3$ exceeding 0.050 and a ratio of the amount of NH of less than 0.045, based on the amount of aromatic ring hydrogen of xylene when $^1$H-NMR of a 17% by mass solution of polysilazane dissolved in xylene is measured. A siliceous film-forming composition comprising the polysilazane. A method for producing a siliceous film comprising applying the polysilazane composition above a substrate.

10 Claims, No Drawings

POLYSILAZANE, SILICEOUS FILM-FORMING COMPOSITION COMPRISING THE SAME, AND METHOD FOR PRODUCING SILICEOUS FILM USING THE SAME

CROSS-REFERENCE TO RELATED APPLICATIONS

This application is a National stage application (under 35 U.S.C. § 371) of PCT/EP2021/076728, filed Sep. 29, 2021, which claims benefit of U.S. Application No. 63/087,139, filed Oct. 2, 2020, both of which are incorporated herein by reference in their entirety.

BACKGROUND OF THE INVENTION

Technical Field

The present invention relates to a polysilazane and a siliceous film-forming composition comprising the same. The present invention also relates to a method for producing a siliceous film using them, a siliceous film, and an electronic device comprising the siliceous film.

Background Art

In the manufacture of electronic devices, especially semiconductor devices, an interlayer insulating film is sometimes formed between a transistor element and a bit line, between a bit line and a capacitor, between a capacitor and a metal wiring and between plural metal wirings, etc. Further, an insulating material is sometimes embedded in an isolation trench provided on a substrate surface or the like. Furthermore, after manufacturing a semiconductor device on a substrate surface, a coating layer is formed using a sealing material to form a package. Such an interlayer insulating film or coating layer is often formed of a siliceous material.

In the field of electronic devices, the device rule has been gradually miniaturized, and the size of an insulating structure etc. separating each element to be incorporated in the device, is also required to be miniaturized. However, with the progress of miniaturization of the insulating structure, the occurrence of defects in a siliceous film constituting a trench etc. has been increasing, and efficiency of manufacturing the electronic device has declined.

As a method for producing the siliceous film, a chemical vapor deposition method (CVD method), a sol-gel method, a method for coating and baking a composition comprising a silicon-containing polymer, and the like are conventionally used. Among them, a method for producing a siliceous film using a composition is often adopted, since it is relatively simple. In order to produce such a siliceous film, a composition comprising a silicon-containing polymer such as polysilazane, polysiloxane, polysiloxazane, or polysilane is coated on a substrate surface or the like and then baked, whereby silicon that is contained in the polymer is oxidized to form a siliceous film. For such cases, methods for reducing defects of formed siliceous films have been studied. For example, methods for forming siliceous films having less defects by using a perhydropolysilazane having a certain structure have been studied (Patent document 1).

PRIOR ART DOCUMENTS

Patent Documents

[Patent document 1] WO 2015/087847 A1

SUMMARY OF THE INVENTION

Problems to be Solved by the Invention

The present inventors have considered that there are one or more objectives that still need improvements, such as:

providing a polysilazane that can form a siliceous film having fewer defects: providing a polysilazane that can suppress film shrinkage at the time of conversion to a siliceous film; providing a polysilazane that can decrease residual stress of a siliceous film; and providing a polysilazane that can suppress crack generation in trench.

Means for Solving the Problems

The present invention provides a polysilazane having a ratio of the amount of $SiH_3$ exceeding 0.050 and a ratio of the amount of NH of less than 0.045, based on the amount of aromatic ring hydrogen of xylene when $^1$H-NMR of a 17% by mass solution of polysilazane dissolved in xylene is measured.

The present invention further provides a siliceous film-forming composition that comprises the above mentioned polysilazane and a solvent.

The present invention further provides a method for producing a siliceous film comprises the steps of applying the above mentioned siliceous film-forming composition above a substrate and heating it.

The present invention further provides a siliceous film produced by the above mentioned method.

The present invention further provides an electronic device that comprises the siliceous film produced by above mentioned method.

Effects of the Invention

The polysilazane of the present invention, along with the other embodiments of the invention described herein, provide one or more of the following desirable effects:

a siliceous film having fewer defects can be formed: shrinkage at the time of conversion to a siliceous film can be suppressed; residual stress of a siliceous film can be decreased; crack generation in trench can be suppressed.

MODE FOR CARRYING OUT THE INVENTION

Definition

Unless otherwise specified in the present specification, the following definitions and examples are followed.

The singular form includes the plural form and "one" or "that" means "at least one". An element of a concept can be expressed by a plurality of species, and when the amount (for example, % by mass or mol %) is described, it means sum of the plurality of species.

"And/or" includes a combination of all elements and also includes single use of the element.

When a numerical range is indicated using "to" or "-", it includes both endpoints and units thereof are common. For example, 5 to 25 mol % means 5 mol % or more and 25 mol % or less.

The descriptions such as "$C_{x-y}$", "$C_x$-$C_y$" and "$C_x$" mean the number of carbons in a molecule or substituent. For example, $C_{1-6}$ alkyl means an alkyl chain having 1 or more and 6 or less carbons (methyl, ethyl, propyl, butyl, pentyl, hexyl etc.).

When polymer has plural types of repeating units, these repeating units copolymerize. These copolymerization can be any of alternating copolymerization, random copolymerization, block copolymerization, graft copolymerization, or a mixture thereof. When polymer or resin is represented by a structural formula, n, m or the like that is attached next to parentheses indicate the number of repetitions.

Celsius is used as the temperature unit. For example, 20 degrees means 20 degrees Celsius.

Embodiments of the present invention are described below in detail.

[Polysilazane]

Polysilazane contains N—Si bonds as repeating units. The polysilazane according to the present invention is characterized by its molecular structure, and is characterized by having more —$SiH_3$ structure and less —NH— structure than the conventionally generally known polysilazane. Characteristics of such a structure can be detected by the quantitative NMR. That is, the polysilazane according to the present invention exhibits a certain characteristic value when evaluated by the quantitative NMR. In particular, the analysis is performed by comparing the integrated values of the signal derived from the internal standard substance and that derived from the substance to be measured (internal standard method).

When $^1$H-NMR of a 17% by mass solution of polysilazane according to the present invention dissolved in xylene as an internal standard substance is measured, the ratio of the amount of $SiH_3$ exceeds 0.050, preferably 0.055 or more, more preferably 0.060 or more, further preferably 0.070 or more, and the ratio of the amount of NH is less than 0.045, preferably 0.040 or less, more preferably 0.035 or less, based on the amount of aromatic ring hydrogen of xylene.

Polysilazane having such a structure can suppress the shrinkage of the film when it is cured to form a siliceous film, and can also suppress the formation of cracks inside the trench due to low residual stress.

The polysilazane according to the present invention is preferably perhydropolysilazane (hereinafter, also referred to as PHPS). PHPS contains Si—N bonds as repeating units and consists only of Si, N and H. In this PHPS, except for the Si—N bonds, all the elements bonding to Si or N are H, and any other elements such as carbon or oxygen are not substantially contained.

The polysilazane according to the present invention preferably comprises at least one of the repeating units selected from the group consisting of the groups represented by the formulae (Ia) to (If), and the terminal group represented by the formula (Ig).

(Ia)

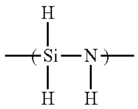

(Ib)

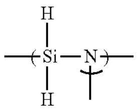

-continued (Ic)

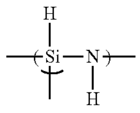

(Id)

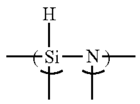

(Ie)

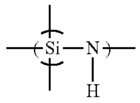

(If)

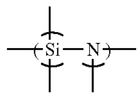

(Ig)

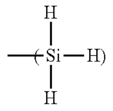

The polysilazane according to the present invention more preferably substantially consists of at least one of the repeating units selected from the group consisting of the groups represented by the formulae (Ia) to (If), and the terminal group represented by the formula (Ig). In the present invention, "substantially" means that 95% by mass or more of all the structural units contained in polysilazane are groups represented by the formulae (Ia) to (If), and the terminal group represented by the formula (Ig). More preferably, the polysilazane contains no structural units other than the groups represented by the formulae (Ia) to (If) and the terminal group represented by the formula (Ig), that is, it consists of at least one of the repeating units selected from the group consisting of the groups represented by the formulae (Ia) to (If) and the terminal group represented by the formula (Ig).

An example of structure of such polysilazane is one represented by the following.

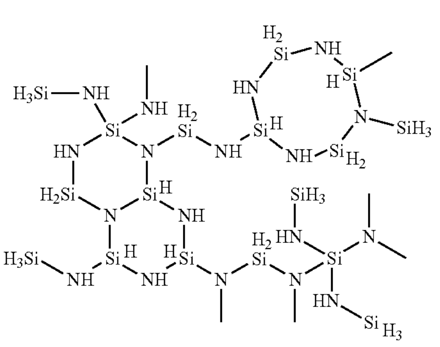

The mass average molecular weight of the polysilazane according to the present invention is preferably 3,000 to 25,000. It is preferred that the mass average molecular weight of polysilazane is larger to reduce the low molecular weight components that scatter (evaporate) when converting to siliceous, and prevent volume shrinkage due to the scattering of low molecular weight components, and consequently to prevent lower density inside the fine trenches. On the other hand, when polysilazane is dissolved in a solvent to prepare a composition, it is necessary to increase the coatability of the composition. In particular, it is needed to make the viscosity of the composition excessively high, and to control the curing rate of the composition in order to ensure the permeability of the composition into uneven portions. From this point of view, the mass average molecular weight of the polysilazane according to the present invention is more preferably 4,000 to 22,000, further preferably 5,000 to 20,000. The mass average molecular weight is a weight average molecular weight in terms of polystyrene, and can be measured by the gel permeation chromatography based on polystyrene.

[Method for Manufacturing Polysilazane]

A method for producing polysilazane according to the present invention comprises, for example, a step of performing a reaction of at least one halosilane compound represented by the formula (1) with ammonia in a solvent having a relative dielectric constant of 10.0 or less as a reaction solvent at −30 to 50° C.

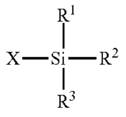

(1)

wherein $R^1$, $R^2$ and $R^3$ are each independently hydrogen, halogen or $C_{1-4}$ alkyl, preferably hydrogen, Cl, Br or methyl, more preferably hydrogen or Cl, and X is each independently F, Cl, Br or I, preferably Cl.

Examples of the halosilane compound represented by the formula (1) include trichlorosilane, dichlorosilane, tetrachlorosilane, monochlorosilane, bromodichlorosilane, bromochlorosilane, dibromodichlorosilane, tribromosilane, dibromosilane, tetrabromosilane, monobromosilane, methyltrichlorosilane, methyltribromosilane, methyl-dichlorosilane, methyldibromosilane, methylchlorosilane, dimethyldichlorosilane, dimethyldibromosilane and methylbromosilane. These can be used alone or in combination.

The reaction solvent has a relative dielectric constant of 10.0 or less, preferably 9.0 or less, and any solvent can be used as long as it does not decompose polysilazane. Examples of such a solvent include propylene glycol alkyl ether acetates such as propylene glycol monomethyl ether acetate, propylene glycol monoethyl ether acetate and propylene glycol monopropyl ether acetate; esters such as methyl acetate, ethyl acetate, isopropyl acetate, butyl acetate and isopentyl acetate; aromatic hydrocarbons such as benzene, toluene, xylene, mesitylene, ethylbenzene, cumene, vinylbenzene, tetraline, naphthalene and toluidine; ethers such as diethyl ether, diisopropyl ether, dibutyl ether, anisole, tetrahydrofuran and dioxane; aliphatic hydrocarbons such as pentane, hexane, heptane, octane, nonane, decane, isopentane and trimethylpentane; alicyclic hydrocarbons such as cyclopentane, cyclohexane, methylcyclohexane, cycloheptane, cyclooctane, decalin, cyclohexene, dipentene and α-pinen; halogenated hydrocarbons such as chlorobenzene, bromobenzene, dichloromethane, chloroform, carbon tetrachloride, trichloroethane, ethyl bromide, propyl bromide, isopropyl chloride, butyl chloride, dichloropropane and tetrachloroethane; and amines, such as diethylamine, triethylamine and aniline. Preferred solvents are hexane, heptane, octane, cyclohexane, methylcyclohexane, cyclooctane, toluene and xylene.

These solvents are used alone or in combination of any of two or more. The relative dielectric constant of the solvent is measured using a liquid dielectric constant meter Model871 (Nihon Rufuto Co., Ltd.).

A solvent having a relative dielectric constant exceeding 10.0 (for example, tetramethylethylene-diamine, amylamine, methylethylketone, butylmethyl-ketone, cyclohexanone, diethylketone, pyridine and picoline) can be combined with a solvent having a relative dielectric constant of 10.0 or less to use also as a mixed solvent.

Although not wishing to be bound by theory, it is thought there is an effect that using a solvent having a relative dielectric constant of 10 or less suppresses dehydrogenation condensation in $SiH_3$, which is mainly formed by disproportionation of halosilane compounds, and promotes dehydrogenation condensation in NH.

The above reaction is carried out in the above-described solvent in a temperature range of −30 to 50° C., preferably −20 to 30° C.

As the reaction atmosphere, atmospheric air can be used, but preferably, a hydrogen atmosphere, an atmosphere of inert gas such as dry nitrogen and dry argon, or a mixed atmosphere thereof is used. During the reaction, pressure is applied by hydrogen that is a by-product, but pressurization is not always necessary, and normal pressure can be adopted. In addition, the reaction time varies depending on various conditions such as type and concentration of the raw material, type and concentration of the solvent, and the polycondensation reaction temperature, but can generally be in the range of 0.5 hour to 40 hours.

The polysilazane obtained by the above step exhibits excellent properties, and the obtained structure includes, for example, those exemplified above, but it is conceivable that a structure other than the above examples can be taken since it can have various structures depending on the raw material, the mixing ratio, and the like.

[Siliceous Film-Forming Composition]

The siliceous film-forming composition according to the present invention (hereinafter referred to as the composition) comprises polysilazane according to the present invention and a solvent.

Solvents used in the present invention include but are not limited to (a) aromatic compounds, such as benzene, toluene, xylene, ethylbenzene, diethylbenzene, trimethylbenzene and triethylbenzene; (b) saturated hydrocarbon compounds such as cyclohexane, decahydronaphthalene, dipentane, n-pentane, i-pentane, n-hexane, i-hexane, n-heptane, i-heptane, n-octane, i-octane, n-nonane, i-nonan, n-decane, ethylcyclohexane, methylcyclohexane, cyclohexane and p-mentane; (c) unsaturated hydrocarbons such as cyclohexene; (d) ethers such as dipropyl ether, dibutyl ether and anisole; (e) esters such as n-butyl acetate, i-butyl acetate, n-amyl acetate and i-amyl acetate; and (f) ketones such as methylisobutylketone (MIBK). Moreover, by using plural kinds of solvents, solubility of polysilazane and evaporation rate of the solvent can be adjusted.

So as to improve the workability by the coating method to be adopted and further taking it into consideration that permeability of the solution into the fine trenches and the film thickness required outside the trenches, the blending amount of the solvent in the composition can be appropriately selected according to the mass average molecular weight of polysilazane to be used, and its distribution and structure. The composition according to the present invention comprises polysilazane of preferably 0.10 to 70% by mass, more preferably 1.0 to 30% by mass, based on the total mass of the composition.

[Method for Forming a Siliceous Film]

A method for producing a siliceous film according to the present invention comprises applying the composition according to the present invention above a substrate and heating it. In the present invention, the "above a substrate" includes the case where the composition is applied directly on a substrate and the case where the composition is applied on a substrate via one or more intermediate layer.

The shape of the substrate is not particularly limited, and can be freely selected depending on the intended purpose. However, since the composition according to the present invention has a feature that it easily penetrates into narrow trenches or the like and can form a uniform siliceous film even inside the trenches, it is preferably applied to a substrate having trenches and holes with a high aspect ratio. In particular, it is preferably applied to a substrate having at least one trench with a width of the deepest portion of 0.02 μm or less and an aspect ratio of 20 or more. Here, the shape of the trench is not particularly limited, and the cross section thereof can be any shape such as a rectangular shape, a forward tapered shape, a reverse tapered shape and a curved surface shape. Both ends of the trench can be open or closed.

In a conventional method, even if an attempt is made to fill a trench, having a width at the deepest part of 0.02 μm or less and an aspect ratio of 20 or more, with a siliceous material, the density inside the trench was less than of the density outside the trench due to a large volume shrinkage at the time of conversion to siliceous, and thus it was difficult to fill the trenches so that the material was homogeneous inside and outside the trenches. On the contrary, according to the present invention, a uniform siliceous film can be obtained inside and outside the trench. Such an effect of the present invention becomes more remarkable when a substrate having very fine trenches such as a width of 0.01 μm or less at the deepest portion is used.

Typical examples of the substrate having at least one trench with a high aspect ratio include a substrate for an electronic device comprising a transistor device, a bit line, a capacitor, and the like. For the production of such electronic devices, the following steps are included in some cases: a step of forming an insulating film between a transistor device and a bit line called PMD, between a transistor device and a capacitor, between a bit line and a capacitor or between a capacitor and a metal wiring, and an insulating film between a plurality of metal wirings called IMD, or a step of filling an isolation trench, followed by a through-hole forming step that includes forming a hole that vertically penetrates the material filled in the fine trench.

The present invention is suitable also for any other application in which a substrate having a high aspect ratio is required to be filled with a homogeneous siliceous material inside and outside the trench. Examples of such applications include undercoating of liquid crystal glass (passivation film of such as Na), overcoating of liquid crystal color filter (insulating planalization film), gas barrier of film liquid crystal, hard coating of substrate (metal, glass), heat/oxidation resistant coating, antifouling coating, water-repellent coating, hydrophilic coating, ultraviolet ray cutting coating for glass or plastic, and colored coating.

The method for applying the curing composition above such a substrate is not particularly limited, and examples thereof include any usual application method, such as a spin coating method, a dipping method, a spraying method, a transfer method, and a slit coating method.

After application of the curing composition, a drying step is performed for the purpose of drying or pre-curing the coating film in accordance with the treating conditions of 10 seconds to 30 minutes at a temperature of 50 to 400° C., in air, an inert gas or an oxygen gas. The solvent is removed by drying and the fine trenches are substantially filled with polysilazane.

According to the present invention, polysilazane contained inside and outside the trenches is converted into a siliceous material by heating. When heating, it is preferable to heat in a steam atmosphere.

The steam atmosphere means an atmosphere in which the partial pressure of steam is in the range of 0.50 to 101 kPa, preferably 1.0 to 90 kPa, and more preferably 1.5 to 80 kPa. The heating can be carried out in the temperature range of 300 to 1,200° C.

If the heating is performed in an atmosphere containing steam at a high temperature, for example, at a temperature exceeding 600° C. and the other elements such as electronic devices that are simultaneously exposed to the heat treatment, there is a concern that the other elements can be adversely effected. In such cases, the silica conversion step can be divided into two or more steps, in which heating can be performed first in an atmosphere containing steam at a relatively low temperature, for example, in a temperature range of 300 to 600° C. and then in an atmosphere containing no steam at a higher temperature, for example, in a temperature range of 500 to 1200° C.

Any gas can be used as a component other than steam in an atmosphere containing steam (hereinafter referred to as the dilution gas), and particular examples thereof include air, oxygen, nitrogen, helium, and argon. As the dilution gas, it is preferable to use oxygen in terms of the film quality of the siliceous material to be obtained. However, the dilution gas is appropriately selected in consideration also of the influence on other elements such as electronic devices that are exposed to the heat treatment. In addition, as the atmosphere containing no steam in the above-mentioned two-step heating method, in addition to the atmosphere containing any of the above-mentioned dilution gases, a reduced pressure or vacuum atmosphere of less than 1.0 kPa can also be adopted.

There are no particular restrictions on the heating rate and the cooling rate to the target temperature during heating, and it can generally be in the range of 1° C. to 100° C./min. The holding time after reaching the target temperature is not particularly limited, and it can generally be in the range of 1 minute to 10 hours.

By the above heating step, polysilazane is converted to a siliceous material mainly composed of Si—O bonds through a hydrolysis reaction with steam. When a siliceous film is formed on the surface of a substrate having a trench with a high aspect ratio using the composition according to the present invention, it becomes homogeneous both inside and outside the trench. According to the method of the present invention, since there is no conformality like the CVD method, filling inside the fine trench can be uniformly performed. Further, although densification of the silica film according to the conventional method was insufficient, densification of the film after conversion to silica according to the method of the present invention is promoted, and cracks are less likely to occur.

As described above, since the siliceous film according to the present invention is obtained by the hydrolysis reaction of polysilazane, it is mainly composed of Si—O bonds, but also contains some Si—N bonds depending on the degree of conversion. That is, the fact that some Si—N bonds are contained in the siliceous material indicates that the material is derived from polysilazane. In particular, the siliceous film according to the present invention contains nitrogen in the range of 0.005 to 5% by atomic percentage. In fact, it is difficult to reduce this nitrogen content below 0.005%. The atomic percentage of nitrogen can be measured by the secondary ion mass spectrometry.

In the method for forming a siliceous film according to the present invention, the thickness of the siliceous film formed on the surface of the substrate and the thickness of the coating film formed on the surface outside the trench are not particularly limited, and they can generally be any thickness within a range in which no crack occurs in the film during conversion to siliceous material. As described above, according to the method of the present invention, cracks are unlikely to occur in the coating film even when the film thickness is 0.5 μm or more. Therefore, for example, in a contact hole having a width of 1000 nm, a trench having a depth of 2.0 μm can be filled substantially without any defect.

The method for producing an electronic device according to the present invention comprises the above-mentioned producing method.

EXAMPLES

The present invention is described below by use of the various examples. In addition, aspects of the present invention are not limited only to these examples.

Example 11: Synthesis of Polysilazane A

After replacing the inside of a 10 L reaction vessel equipped with a cooling condenser, a mechanical stirrer and a temperature control device with dry nitrogen, a mixed solvent of 1,000 ml of dry pyridine and 1,500 ml of xylene is put into the reaction vessel and cooled to 0° C. The relative dielectric constant of the mixed solvent is 6.70. The relative dielectric constant of the solvent is measured using a liquid dielectric constant meter Model871 (Nihon Rufuto Co., Ltd.). Thereafter, 100 g of dichlorosilane is added, and the temperature of the solution is raised to 30° C. with stirring. The temperature of the solution is kept at 30° C. and 80 g of ammonia is slowly blown into it with stirring. Subsequently, after continuing to stir for 30 minutes, dry nitrogen is blown into the liquid layer for 30 minutes to remove excess ammonia. Pressure filtration of the obtained slurry-like product is performed in a dry nitrogen atmosphere using a 0.2 μm filter made of Teflon (registered trademark) to obtain 2,000 ml of a filtrate. After distillation of pyridine that is the filtrate, xylene is added to obtain a xylene solution of polysilazane having a concentration of 30.2% by mass. The mass average molecular weight of the obtained polysilazane (hereinafter referred to as Mw) is measured by gel permeation chromatography and is 2,580 in terms of polystyrene. The polysilazane obtained in accordance with this formulation is hereinafter referred to as Intermediate (A).

After replacing the inside of a 10 L reaction vessel equipped with a cooling condenser, a mechanical stirrer and a temperature control device with dry nitrogen, 1,000 g of pyridine and 8.0 g of xylene are added to 200 g of Intermediate (A) to adjust the concentration of polysilazane to be 5.0% by mass and the mixture is stirred so as to be uniform while bubbling with nitrogen gas of 0.5 NL/min. Subsequently, a reforming reaction is carried out at 120° C. for 8 hours to obtain Polysilazane A.

Example 12: Synthesis of Polysilazane B

After replacing the inside of a 10 L reaction vessel equipped with a cooling condenser, a mechanical stirrer and a temperature control device with dry nitrogen, a mixed solvent of 750 ml of dry pyridine and 1,750 ml of cyclooctane is put into the reaction vessel and cooled to 0° C. The relative dielectric constant of the mixed solvent is 5.32. Thereafter, 95 g of dichlorosilane is added, it is confirmed that the reaction mixture has become 0° C. or lower, and 80 g of ammonia is slowly blown into it with stirring. Subsequently, after continuing to stir for 30 minutes, dry nitrogen is blown into the liquid layer for 30 minutes to remove excess ammonia. Pressure filtration of the obtained slurry-like product is performed in a dry nitrogen atmosphere using a 0.2 μm filter made of Teflon (registered trademark) to obtain 1,900 ml of a filtrate. After distillation of the solvent that is the filtrate, xylene is added to obtain a xylene solution of polysilazane having a concentration of 29.2% by mass. The Mw of the obtained polysilazane is 1,210. The polysilazane obtained in accordance with this formulation is hereinafter referred to as Intermediate (B).

After replacing the inside of a 10 L reaction vessel equipped with a cooling condenser, a mechanical stirrer and a temperature control device with dry nitrogen, 950 g of pyridine and 18.0 g of xylene are added to 200 g of Intermediate (B) to adjust the concentration of polysilazane to be 5.0% by mass and the mixture is stirred so as to be uniform while bubbling with nitrogen gas of 0.5 NL/min. Subsequently, a reforming reaction is carried out at 120° C. for 8 hours to obtain Polysilazane B.

Example 13: Synthesis of Polysilazane C

After replacing the inside of a 10 L reaction vessel equipped with a cooling condenser, a mechanical stirrer and a temperature control device with dry nitrogen, 2,500 ml of xylene as a solvent is put into the reaction vessel and cooled to 0° C. The relative dielectric constant of the solvent is 2.58. Thereafter, 95 g of dichlorosilane is added, it is confirmed that the reaction mixture has become 0° C. or lower, and 80 g of ammonia is slowly blown into it with stirring. Subsequently, after continuing to stir for 30 minutes, dry nitrogen is blown into the liquid layer for 30 minutes to remove excess ammonia. Pressure filtration of the obtained slurry-like product is performed in a dry nitrogen atmosphere using a 0.2 μm filter made of Teflon (registered trademark) to obtain 1,800 ml of a filtrate. The solvent that is the filtrate is partially distilled off to obtain a xylene solution of polysilazane having a concentration of 29.8% by mass. The Mw of the obtained polysilazane is 1,100. The polysilazane obtained in accordance with this formulation is hereinafter referred to as Intermediate (C).

After replacing the inside of a 10 L reaction vessel equipped with a cooling condenser, a mechanical stirrer and a temperature control device with dry nitrogen, 980 g of pyridine and 12.0 g of xylene are added to 200 g of Intermediate (C) to adjust the concentration of polysilazane to be 5.0% by mass and the mixture is stirred so as to be uniform while bubbling with nitrogen gas of 0.5 NL/min. Subsequently, a reforming reaction is carried out at 120° C. for 8 hours to obtain Polysilazane C.

Example 14: Synthesis of Polysilazane D

After replacing the inside of a 10 L reaction vessel equipped with a cooling condenser, a mechanical stirrer and a temperature control device with dry nitrogen, 2,500 ml of cyclooctane as a solvent is put into the reaction vessel and cooled to 0° C. The relative dielectric constant of the solvent is 2.15. Thereafter, 95 g of dichlorosilane is added, and the temperature of the solution is raised to 30° C. with stirring. The temperature of the solution is kept at 30° C. and 80 g of ammonia is slowly blown into it with stirring. Subsequently, after continuing to stir for 30 minutes, dry nitrogen is blown into the liquid layer for 30 minutes to remove excess ammonia. Pressure filtration of the obtained slurry-like product is performed in a dry nitrogen atmosphere using a 0.2 μm filter made of Teflon (registered trademark) to obtain 2,000 ml of a filtrate. The solvent that is the filtrate is distilled off, and xylene is added to obtain a xylene solution of polysilazane having a concentration of 30.2% by mass. The Mw of the obtained polysilazane is 1,420. The polysilazane obtained in accordance with this formulation is hereinafter referred to as Intermediate (D).

After replacing the inside of a 10 L reaction vessel equipped with a cooling condenser, a mechanical stirrer and a temperature control device with dry nitrogen, 900 g of pyridine and 7.2 g of xylene are added to 180 g of Intermediate (D) to adjust the concentration of polysilazane to be 5.0% by mass and the mixture is stirred so as to be uniform while bubbling with nitrogen gas of 0.5 NL/min. Subsequently, a reforming reaction is carried out at 120° C. for 8 hours to obtain Polysilazane D.

Example 15: Synthesis of Polysilazane E

After replacing the inside of a 10 L reaction vessel equipped with a cooling condenser, a mechanical stirrer and a temperature control device with dry nitrogen, 2,500 ml of methylcyclohexane as a solvent is put into the reaction vessel and cooled to −20° C. The relative dielectric constant of the solvent is 1.99. Thereafter, 95 g of dichlorosilane is added, it is confirmed that the reaction mixture has become −20° C. or lower, and 80 g of ammonia is slowly blown into it with stirring. Subsequently, after continuing to stir for 30 minutes, dry nitrogen is blown into the liquid layer for 30 minutes to remove excess ammonia. Pressure filtration of the obtained slurry-like product is performed in a dry nitrogen atmosphere using a 0.2 μm filter made of Teflon (registered trademark) to obtain 1,800 ml of a filtrate. The solvent that is the filtrate is distilled off, and xylene is added to obtain a xylene solution of polysilazane having a concentration of 29.8% by mass. The Mw of the obtained polysilazane is 950. The polysilazane obtained in accordance with this formulation is hereinafter referred to as Intermediate (E).

After replacing the inside of a 10 L reaction vessel equipped with a cooling condenser, a mechanical stirrer and a temperature control device with dry nitrogen, 850 g of pyridine is added to 160 g of Intermediate (E) to adjust the concentration of polysilazane to be 4.7% by mass and the mixture is stirred so as to be uniform while bubbling with nitrogen gas of 0.5 NL/min. Subsequently, a reforming reaction is carried out at 120° C. for 8 hours to obtain Polysilazane E.

Example 16: Synthesis of Polysilazane F

After replacing the inside of a 10 L reaction vessel equipped with a cooling condenser, a mechanical stirrer and a temperature control device with dry nitrogen, 2,500 ml of n-octane as a solvent is put into the reaction vessel and cooled to 0° C. The relative dielectric constant of the solvent is 1.96. Thereafter, 95 g of dichlorosilane is added, it is confirmed that the reaction mixture has become 0° C. or lower, and 80 g of ammonia is slowly blown into it with stirring. Subsequently, after continuing to stir for 30 minutes, dry nitrogen is blown into the liquid layer for 30 minutes to remove excess ammonia. Pressure filtration of the obtained slurry-like product is performed in a dry nitrogen atmosphere using a 0.2 μm filter made of Teflon (registered trademark) to obtain 1,800 ml of a filtrate. The solvent that is the filtrate is distilled off, and xylene is added to obtain a xylene solution of polysilazane having a concentration of 30.1% by mass. The Mw of the obtained polysilazane is 1,220. The polysilazane obtained in accordance with this formulation is hereinafter referred to as Intermediate (F).

After replacing the inside of a 10 L reaction vessel equipped with a cooling condenser, a mechanical stirrer and a temperature control device with dry nitrogen, 980 g of pyridine is added to 180 g of Intermediate (F) to adjust the concentration of polysilazane to be 4.7% by mass and the mixture is stirred so as to be uniform while bubbling with nitrogen gas of 0.5 NL/min. Subsequently, a reforming reaction is carried out at 120° C. for 8 hours to obtain Polysilazane F.

Example 17: Synthesis of Polysilazane G

After replacing the inside of a 10 L reaction vessel equipped with a cooling condenser, a mechanical stirrer and a temperature control device with dry nitrogen, a mixed solvent of 1,000 ml of tetramethylethylene-diamine and 1,500 ml of n-nonane is put into the reaction vessel and cooled to 0° C. The relative dielectric constant of the mixed solvent is 6.26. Thereafter, 95 g of dichlorosilane is added, it is confirmed that the reaction mixture has become 0° C. or lower, and 80 g of ammonia is slowly blown into it with stirring. Subsequently, after continuing to stir for 30 minutes, dry nitrogen is blown into the liquid layer for 30 minutes to remove excess ammonia. Pressure filtration of the obtained slurry-like product is performed in a dry nitrogen atmosphere using a 0.2 μm filter made of Teflon (registered trademark) to obtain 1,900 ml of a filtrate. After distillation of the solvent that is the filtrate, xylene is added to obtain a xylene solution of polysilazane having a concentration of 29.5% by mass. The Mw of the obtained polysilazane is 1,280. The polysilazane obtained in accordance with this formulation is hereinafter referred to as Intermediate (G).

After replacing the inside of a 10 L reaction vessel equipped with a cooling condenser, a mechanical stirrer and a temperature control device with dry nitrogen, 1,000 g of pyridine and 30 g of xylene are added to 200 g of Intermediate (G) to adjust the concentration of polysilazane to be 4.8% by mass and the mixture is stirred so as to be uniform while bubbling with nitrogen gas of 0.5 NL/min. Subsequently, a reforming reaction is carried out at 120° C. for 8 hours to obtain Polysilazane G.

Comparative Example 11: Synthesis of Polysilazane X

After replacing the inside of a 10 L reaction vessel equipped with a cooling condenser, a mechanical stirrer and a temperature control device with dry nitrogen, 2,500 ml of dry pyridine as a solvent is put into the reaction vessel and cooled to 0° C. The relative dielectric constant of the solvent is 12.5. Thereafter, when 100 g of dichlorosilane is added, a white solid adduct ($SiH_2Cl_2·2C_5H_5N$) is produced. It is confirmed that the reaction mixture has become 0° C. or lower, and 80 g of ammonia is slowly blown into it with stirring. Subsequently, after continuing to stir for 30 minutes, dry nitrogen is blown into the liquid layer for 30 minutes to remove excess ammonia. Pressure filtration of the obtained slurry-like product is performed in a dry nitrogen atmosphere using a 0.2 μm filter made of Teflon (registered trademark) to obtain 2,300 ml of a filtrate. Pyridine is distilled off using an evaporator, and xylene is added to obtain a xylene solution of polysilazane having a concentration of 29.8% by mass. The mass average molecular weight of the obtained polysilazane (hereinafter referred to as Mw) is measured by gel permeation chromatography and is 1,230 in terms of polystyrene. The polysilazane obtained in accordance with this formulation is hereinafter referred to as Intermediate (X).

After replacing the inside of a 10 L reaction vessel equipped with a cooling condenser, a mechanical stirrer and a temperature control device with dry nitrogen, 1,000 g of dry pyridine and 200 g of Intermediate (X) obtained above and having a concentration of 29.8% by mass are put into it and the mixture is stirred so as to be uniform while bubbling with nitrogen gas of 0.5 NL/min. Subsequently, a reforming reaction is carried out at 120° C. for 8 hours to obtain Polysilazane X.

[Mass Average Molecular Weight]

The mass average molecular weight of the obtained polysilazane is measured by gel permeation chromatography (GPC) based on polystyrene. The GPC measurement is carried out using an Alliance™ e2695 type high-speed GPC system (Nihon Waters K.K.) and a Super Multipore HZ-N type GPC column (Tosoh Corporation). The measurement is carried out using monodisperse polystyrene as a standard sample and chloroform as a developing solvent under the measuring conditions of a flow rate of 0.6 nil/min and a column temperature of 40° C., and then the mass average molecular weight is calculated as a relative molecular weight to the standard sample.

The results obtained are as shown in Table 1.

[$^1$H-NMR]

The $^1$H-NMR measurement is carried out using a sample solution obtained by dissolving the obtained polysilazane in xylene and having a polysilazane concentration of 17% by mass. Each sample solution is measured 80 times using a JNM-ECS400 type nuclear magnetic resonance apparatus (JEOL Ltd.) to obtain a $^1$H-NMR spectrum. The amount of $SiH_3$, the amount of NH and the amount of $SiH_{1,2}$, based on the amount of aromatic ring hydrogen of xylene, are measured. The results obtained are as shown in Table 1.

TABLE 1

| | | | 1H-NMR | | |
|---|---|---|---|---|---|
| | | Mw | SiH3/ xylene | NH/ xylene | SiH1,2/ xylene |
| Example 11 | Polysilazane A | 18,067 | 0.084 | 0.031 | 0.210 |
| Example 12 | Polysilazane B | 7,418 | 0.076 | 0.037 | 0.190 |
| Example 13 | Polysilazane C | 8,536 | 0.077 | 0.029 | 0.198 |
| Example 14 | Polysilazane D | 8,407 | 0.088 | 0.027 | 0.203 |
| Example 15 | Polysilazane E | 8,982 | 0.073 | 0.025 | 0.178 |
| Example 16 | Polysilazane F | 8,847 | 0.098 | 0.031 | 0.255 |
| Example 17 | Polysilazane G | 10,299 | 0.084 | 0.029 | 0.250 |
| Comparative Example 11 | Polysilazane X | 8,800 | 0.050 | 0.045 | 0.195 |

Example 21

A coating liquid of Polysilazane A is prepared using xylene. Using a spin coater 1HDX2 (Mikasa Co., Ltd.), the coating liquid is applied on a 4-inch high-resistance n-type Si wafer and spin-dried to form a coating film having the film thickness described in Table 2. The film thickness is measured with a spectroscopic ellipsometer M-2000V (J. A. Woollam). Using Fourier transform infrared spectrophotometer FTIR-6600FV (JASCO Corporation), measurement is performed by transmission method under the conditions of number of integrations: 100 times, measurement temperature: room temperature, measurement atmosphere: vacuum, thereby obtaining an infrared absorption spectrum. In the obtained infrared absorption spectrum, the peak area of 3370 $cm^{-1}$ is measured as the $NH_x$ region, and the peak area of 2160 $cm^{-1}$ is measured as the $SiH_x$ region. The results obtained are as shown in Table 2. $NH_x/SiH_x$ in the table is obtained by calculating $NH_x$ region/$SiH_x$ region.

On the contrary, the converted ones for $NH_x$ region and $SiH_x$ region when the film thickness is set to be 450 nm are described in Table 2.

Examples 22 to 25 and Comparative Example 21

The same processing as Example 21 is also performed except that Polysilazane A is changed to polysilazane shown in Table 2. The results obtained are as shown in Table 2.

TABLE 2

| | | Measured value | | | | Converted value at FT = 450 nm | | |
|---|---|---|---|---|---|---|---|---|
| | | NHx region | SiHx region | NHx/SiHx | FT (nm) | NHx region | SiHx region | NHx/SiHx |
| Example 21 | Polysilazane A | 0.997 | 19.626 | 0.0508 | 561.5 | 0.799 | 15.729 | 0.0508 |
| Example 22 | Polysilazane C | 0.916 | 14.670 | 0.0624 | 459.6 | 0.896 | 14.363 | 0.0624 |
| Example 23 | Polysilazane D | 0.725 | 15.080 | 0.0481 | 460.4 | 0.709 | 14.740 | 0.0481 |
| Example 24 | Polysilazane E | 0.827 | 14.772 | 0.0560 | 458.5 | 0.811 | 14.499 | 0.0559 |
| Example 25 | Polysilazane F | 0.761 | 14.535 | 0.0524 | 454.2 | 0.754 | 14.401 | 0.0524 |
| Comparative Example 21 | Polysilazane X | 1.242 | 14.491 | 0.0857 | 453.5 | 1.232 | 14.379 | 0.0857 |

Example 31

A siliceous film-forming composition containing Polysilazane C and xylene that is a solvent is applied on a silicon wafer using a spin coater to form a coating film, and baked (prebaked) at 150° C. for 3 minutes. The film thickness and refractive index after prebaking are measured.

Thereafter, the coating film is heated at 400° C. for 30 minutes in a steam atmosphere, then at 600° C. for 30 minutes in a steam atmosphere and finally at 850° C. for 60 minutes in a nitrogen atmosphere to cure the coating film, thereby forming a siliceous film. The film thickness, refractive index, and residual stress of the siliceous film after curing are measured. Residual stress is compression.

The method for measuring the film thickness is the same as described above, and the refractive index is a value of the wavelength of 633 nm using a spectroscopic ellipsometer M-2000V (J. A. Woollam). The residual stress is measured using a thin film stress measurement system FLX-3300-T (Toho Technology Corporation).

Examples 32 to 34 and Comparative Example 31

The same processing as Example 31 is also performed except that Polysilazane C is changed to polysilazane shown in Table 3. The results obtained are as shown in Table 3.

TABLE 3

| | | After prebaking | | After curing | | | |
|---|---|---|---|---|---|---|---|
| | | FT (nm) | RI (633 nm) | FT (nm) | RI (633 nm) | Film shrinkage (%) | Residual stress (MPa) |
| Example 31 | Polysilazane C | 455.2 | 1.572 | 384.0 | 1.447 | 15.6 | −46 |
| Example 32 | Polysilazane D | 455.0 | 1.571 | 383.6 | 1.448 | 15.7 | −43 |
| Example 33 | Polysilazane E | 455.4 | 1.570 | 386.8 | 1.448 | 15.1 | −32 |
| Example 34 | Polysilazane F | 451.5 | 1.572 | 381.1 | 1.449 | 15.6 | −53 |
| Comparative Example 31 | Polysilazane X | 454.8 | 1.575 | 381.6 | 1.448 | 16.1 | −82 |

Example 41

A siliceous film-forming composition containing Polysilazane B and xylene that is a solvent is applied on a silicon wafer using a spin coater to form a coating film, and baked (prebaked) at 150° C. for 3 minutes. The film thickness and refractive index after prebaking are measured.

Thereafter, the coating film is heated at 300° C. for 30 minutes in an oxygen atmosphere, then at 300° C. for 30 minutes in a steam atmosphere, then at 500° C. for 30 minutes in a steam atmosphere and finally at 500° C. for 60 minutes in a nitrogen atmosphere to cure the coating film, thereby forming a siliceous film. The film thickness and refractive index of the siliceous film after curing are measured.

The methods for measuring the film thickness and refractive index are the same as described above. The results obtained are as shown in Table 4.

Example 42 and Comparative Example 41

The same processing as Example 41 is also performed except that Polysilazane B is changed to polysilazane shown in Table 4. The results obtained are as shown in Table 4.

TABLE 4

| | | After prebaking | | After curing | | |
|---|---|---|---|---|---|---|
| | | FT (nm) | RI (633 nm) | FT (nm) | RI (633 nm) | Film shrinkage |
| Example 41 | Polysilazane B | 2914.9 | 1.542 | 2541.6 | 1.430 | 12.8 |
| Example 42 | Polysilazane C | 3031.4 | 1.535 | 2652.4 | 1.427 | 12.5 |
| Comparative Example 41 | Polysilazane X | 2956.9 | 1.515 | 2528.9 | 1.418 | 14.5 |

[Crack Evaluation]

A siliceous film-forming composition containing Polysilazane C and a solvent is applied on a substrate having a trench with a width of 8 μm and a depth of 9 μm to form a coating film, which is baked at 150° C. for 3 minutes. Thereafter, the coating film is heated at 300° C. for 30 minutes in an oxygen atmosphere, then at 300° C. for 30 minutes in a steam atmosphere, then at 500° C. for 30 minutes in a steam atmosphere and finally at 500° C. for 60 minutes in a nitrogen atmosphere to cure the coating film, thereby forming a siliceous film. When the cross-sectional shape of this substrate is observed using a scanning electron microscope SU8230 (Hitachi Technology) and the presence or absence of cracks is checked, no cracks are confirmed in all of the trenches that are observed.

On the contrary, when the cross section is observed in the same manner using Polysilazane X, cracks are confirmed in 12 of 30 trenches that are observed.

The invention claimed is:

1. A polysilazane having a ratio of the amount of $SiH_3$ of 0.055 or more and a ratio of the amount of NH of less than 0.045, based on the amount of aromatic ring hydrogen of xylene when 1H-NMR of a 17% by mass solution of polysilazane dissolved in xylene is measured, the polysilazane comprises a repeating unit represented by the formula (Ia):

(Ia)

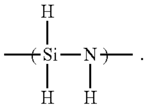

2. The polysilazane according to claim 1, wherein the polysilazane is perhydropolysilazane.

3. The polysilazane according to claim 1, wherein the mass average molecular weight in terms of polystyrene measured by gel permeation chromatography is 3,000 to 25,000.

4. The polysilazane according to claim 1, which is produced by a method comprising a step of performing a reaction of at least one halosilane compound represented by the formula (1) with ammonia in a solvent having a relative dielectric constant of 10.0 or less at −30 to 50° C.

(1)

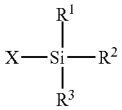

wherein $R^1$, $R^2$ and $R^3$ are each independently hydrogen, halogen or $C_{1-4}$ alkyl, and X is each independently F, Cl, Br or I.

5. A siliceous film-forming composition, comprising the polysilazane according to claim 1, and a solvent.

6. A method for producing the polysilazane according to claim 1, comprising a step of performing a reaction of at least one halosilane compound represented by the formula (1) with ammonia in a solvent having a relative dielectric constant of 10.0 or less at −30 to 50° C.

(1)

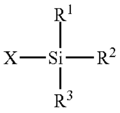

wherein $R^1$, $R^2$ and $R^3$ are each independently hydrogen, halogen or $C_{1-4}$ alkyl, and X is each independently F, Cl, Br or I.

7. A method for producing a siliceous film, comprising applying the siliceous film-forming composition according to claim 5 above a substrate and heating it.

8. The method for producing a siliceous film according to claim 7, wherein the heating is performed under a steam atmosphere.

9. A siliceous film produced by the method according to claim 7.

10. An electronic device comprising the siliceous film as claimed in claim 9.

* * * * *